United States Patent
Wu et al.

(10) Patent No.: US 10,566,368 B1
(45) Date of Patent: Feb. 18, 2020

(54) PIXEL STRUCTURE AND ELECTRIC DEVICE

(71) Applicant: Himax Imaging Limited, Tainan (TW)

(72) Inventors: Yang Wu, Tainan (TW); Fei-Xia Yu, Tainan (TW); Yu Hin Desmond Cheung, Tainan (TW)

(73) Assignee: Himax Imaging Limited, Tainan (TW)

( * ) Notice: Subject to any disclaimer, the term of this patent is extended or adjusted under 35 U.S.C. 154(b) by 0 days.

(21) Appl. No.: 16/101,540

(22) Filed: Aug. 13, 2018

(51) Int. Cl.
*H01L 27/146* (2006.01)

(52) U.S. Cl.
CPC .... *H01L 27/1463* (2013.01); *H01L 27/14612* (2013.01); *H01L 27/14656* (2013.01)

(58) Field of Classification Search
CPC ........... H01L 27/1463; H01L 27/14612; H01L 27/14656
See application file for complete search history.

(56) References Cited

U.S. PATENT DOCUMENTS

| | | | |
|---|---|---|---|
| 8,487,350 B2 * | 7/2013 | Nozaki | H01L 27/14603 257/225 |
| 9,070,802 B2 | 6/2015 | Wu et al. | |
| 9,653,513 B1 | 5/2017 | Wu et al. | |
| 2008/0253046 A1 | 10/2008 | Lou et al. | |
| 2015/0048466 A1 * | 2/2015 | Wu | H01L 31/0352 257/431 |
| 2016/0056201 A1 * | 2/2016 | Yamashita | H01L 27/14654 257/292 |
| 2019/0165034 A1 * | 5/2019 | Kaneda | H01L 27/14698 |

FOREIGN PATENT DOCUMENTS

TW 201508902 A 3/2015

OTHER PUBLICATIONS

B, J. Hosticka et al., "CMOS Imaging for Automotive Applications", IEEE transactions on Electron Devices, vol. 50, No. 1, Jan. 2003.
Yasuo Ishihara et al., "Interline CCD Image Sensor with an Antiblooming Structure", IEEE Transactions on Electron Devices, vol. ED-31, No. 1, Jan. 1984.
G. Agranov et al., "Super Small, Sub 2μm Pixels for Novel CMOS Image Sensors", International Image Sensor Workshop, Jun. 7-10, 2007, Ogunquit Maine, USA.
K. Itonaga et al., "Extremely-Low-Noise CMOS Image Sensor with High Saturation Capacity", 2011 International Electron Devices Meeting.

* cited by examiner

*Primary Examiner* — Fernando L Toledo
*Assistant Examiner* — Neil R Prasad
(74) *Attorney, Agent, or Firm* — CKC & Partners Co., LLC

(57) ABSTRACT

A pixel structure of an image sensor is provided and includes following units. A crystalline layer of a first doping type is formed on a substrate. A photodiode region is formed in the crystalline layer. A gate of a source follower transistor is formed on a top surface of the crystalline layer. A reset gate is formed on the top surface of the crystalline layer. A doped region of a second doping type is formed in the crystalline layer and formed between the reset gate and the gate of the source follower. The first doping type is different from the second doping type, and the photodiode region is connected to the doped region under the top surface of the crystalline layer as an anti-blooming path.

20 Claims, 11 Drawing Sheets

PIXEL STRUCTURE AND ELECTRIC DEVICE

BACKGROUND

Field of Invention

The present invention relates to a pixel structure having an anti-blooming path.

Description of Related Art

A complementary metal-oxide-semiconductor (CMOS) image sensor has been widely applied to mobile applications. The CMOS image sensor may be applied to other applications such as automotive and security. Requirements for the automotive and security applications are quite different from that for the mobile applications. For example, blooming is highly undesirable in automotive and surveillance application. Blooming happens when a pixel is filled up with photo carriers and can no longer collect more electron/hole pairs during pixel exposure. A bright pixel will spreads to several other pixels in the neighboring region.

The road scene, especially at night, has a high dynamic range. The CMOS image sensor is thus required to have a good blooming control at ultra-bright region in order to ensure that the neighboring dimly lit regions are not washed out by the blooming charges. Otherwise, many details get lost and it is difficult to extract the information from the scene. Moreover, at high temperature operation such as in a car, a hot pixel could be filled up by dark current even in the dark. The adjacent good pixels will become hot by receiving the blooming charges.

For the reason that conventional CMOS image sensors could not effectively solve blooming problem, a need has thus arisen to propose a novel CMOS image sensor with improved anti-blooming.

SUMMARY

Embodiments of the invention provide a pixel structure including following units. A crystalline layer of a first doping type is formed on a substrate. A photodiode region is formed in the crystalline layer. A gate of a source follower transistor is formed on a top surface of the crystalline layer. A reset gate is formed on the top surface of the crystalline layer. A doped region of a second doping type is formed in the crystalline layer and formed between the reset gate and the gate of the source follower. The first doping type is different from the second doping type, and the photodiode region is connected to the doped region under the top surface of the crystalline layer as an anti-blooming path.

In some embodiments, the pixel structure further includes an isolation structure extending from the top surface of the crystalline layer and formed between the photodiode region and the doped region. The photodiode region is connected to the doped region under the isolation structure.

In some embodiments, the photodiode region has a first portion of the second doping type that extends toward the doped region under the isolation structure. The doped region has a second portion of the second doping type that extends toward the photodiode region under the isolation structure, and the first portion is connected to the second portion.

In some embodiments, the doped region includes a highly doped region of the second doping type, a lightly doped drain of the second doping type located under the highly doped region, and the second portion which extends toward the photodiode region.

In some embodiments, a doping concentration of the second portion is less than a doping concentration of the highly doped drain.

In some embodiments, the pixel structure further includes a well region of the first doping type formed in the crystalline layer. The well region has a notch to at least partially surround the first portion and the second portion.

In some embodiments, the well region is vertically spaced from a connection interface between the first portion and the second portion by a distance.

In some embodiments, the width of the notch is shorter than a distance between the reset gate and the gate of the source follower.

In some embodiments, the first doping type is P-type, and the second doping type is N-type.

In some embodiments, the doped region is connected to a power supply.

From another aspect, an electrical device including the aforementioned pixel structure is provided.

BRIEF DESCRIPTION OF THE DRAWINGS

The invention can be more fully understood by reading the following detailed description of the embodiment, with reference made to the accompanying drawings as follows.

DETAILED DESCRIPTION

Specific embodiments of the present invention are further described in detail below with reference to the accompanying drawings, however, the embodiments described are not intended to limit the present invention and it is not intended for the description of operation to limit the order of implementation. Moreover, any device with equivalent functions that is produced from a structure formed by a recombination of elements shall fall within the scope of the present invention. Additionally, the drawings are only illustrative and are not drawn to actual size.

Figure 1:
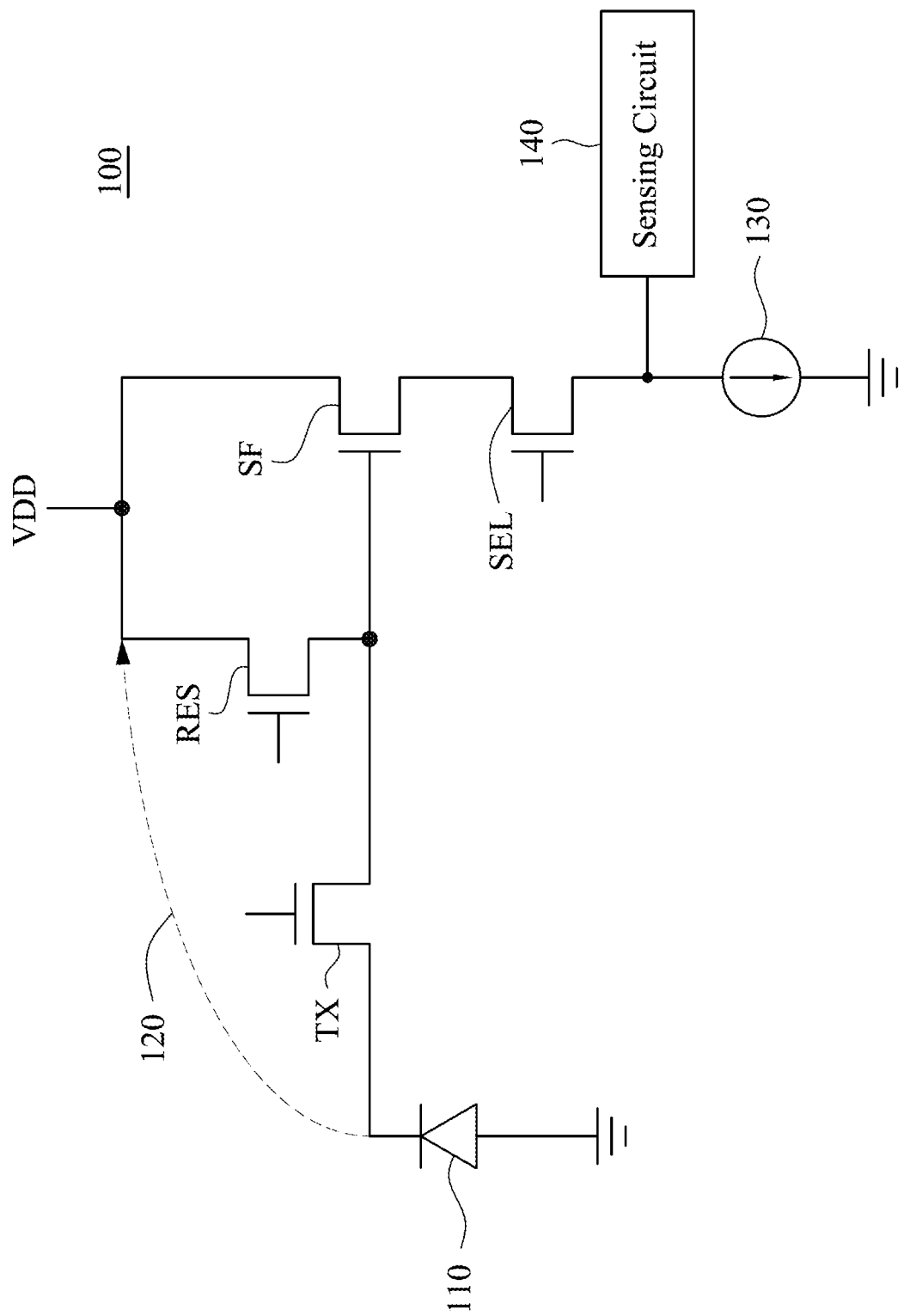
FIG. 1 is a schematic pixel circuit diagram of an image sensor in accordance with an embodiment.

FIG. 1 is a schematic pixel circuit diagram of an image sensor in accordance with an embodiment. Referring to FIG. 1, an image sensor 100 may be applied to a front side illumination (FSI) image sensor or a back side illumination (BSI) image sensor. The image sensor 100 includes multiple pixels, and each of the pixels includes a photodiode 110, a transfer transistor TX, a reset transistor RES, a source follower SF, and a select transistor SEL. The photodiode 110 has an anode electrically connected to the ground, and a cathode electrically connected to a first terminal of the transfer transistor TX. A second terminal of the transfer transistor TX is electrically connected to a first terminal of the reset transistor RES and a gate of the source follower SF. A second terminal of the reset transistor RES is electrically connected to a power supply VDD. The source follower SF has a first terminal electrically connected to the power supply VDD, and a second terminal electrically connected to a first terminal of the select transistor SEL. A second terminal of the select transistor SEL is electrically connected to a bias 130 and outputs to a sensing circuit 140. In the embodiment, an anti-blooming path 120 is provided from the photodiode 110 to the power supply VDD. One pixel structure will be described in detail below.

Figure 2A:
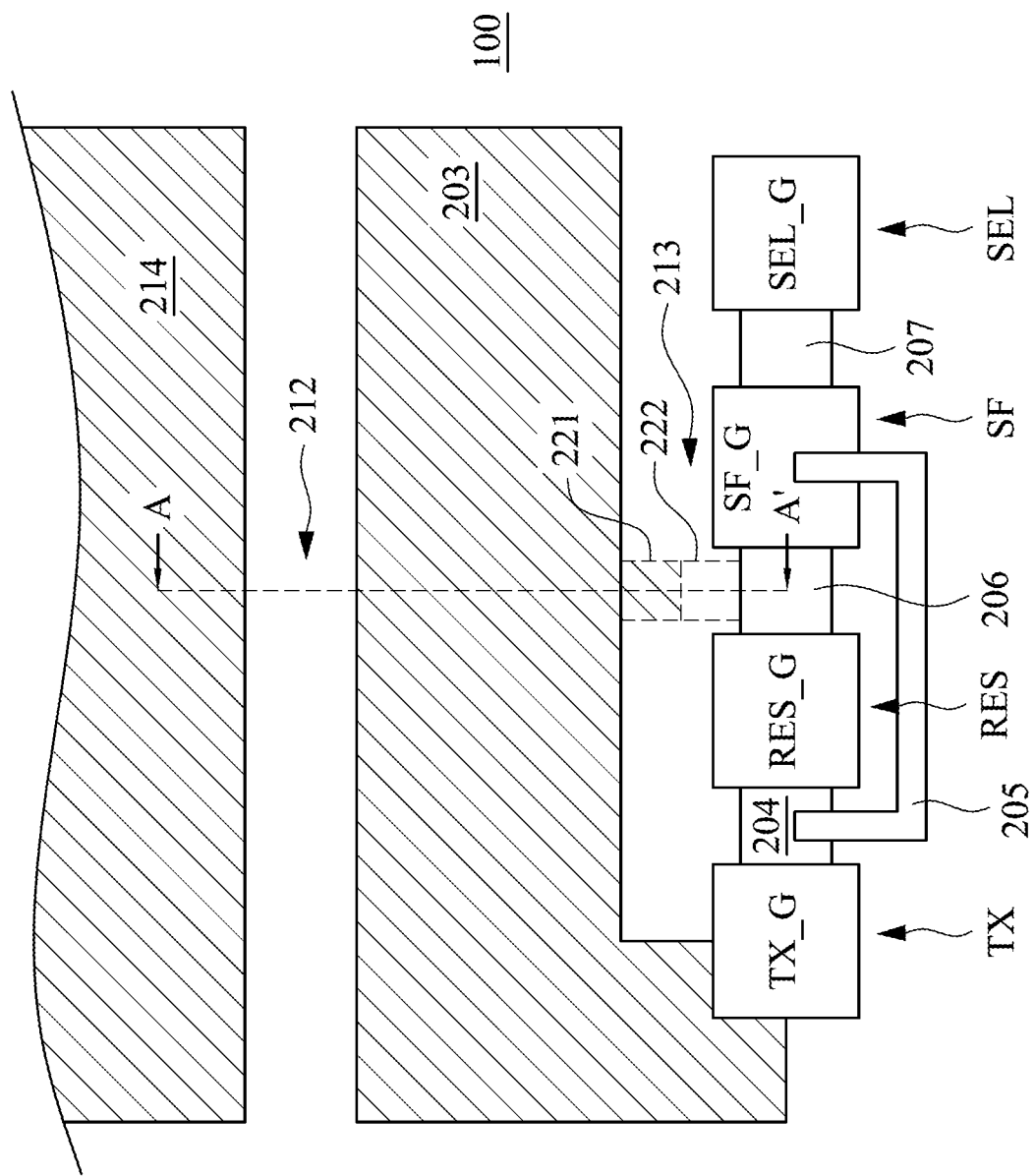
FIG. 2A is a top view of the pixel structure of the image sensor in accordance with an embodiment.
Figure 2B:
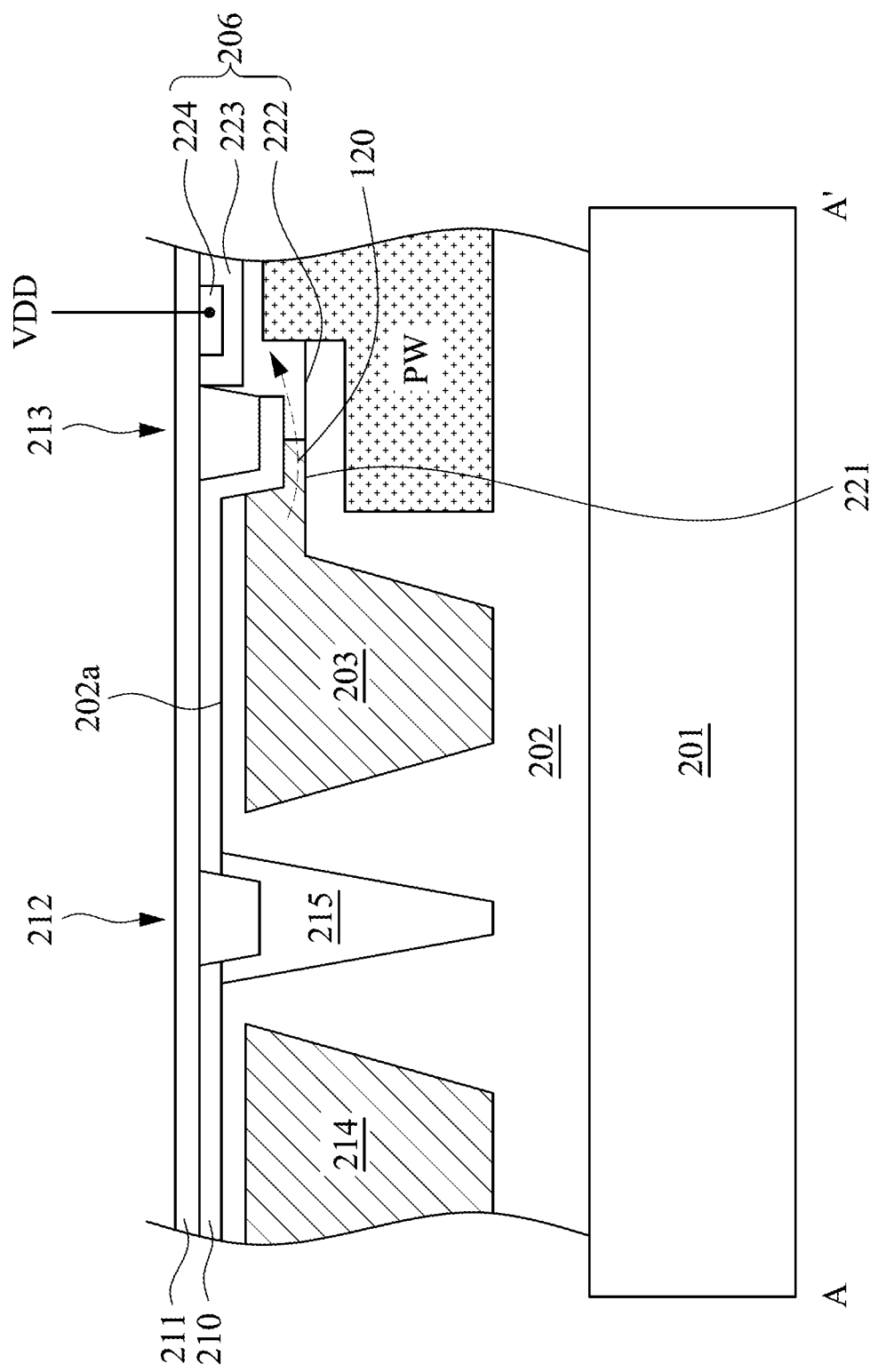
FIG. 2B is a cross-sectional view along a section line AA' of FIG. 2A.

FIG. 2A is a top view of the pixel structure of the image sensor in accordance with an embodiment. FIG. 2B is a cross-sectional view along a section line AA' of FIG. 2A. Referring to FIG. 2A and FIG. 2B, the image sensor 100 includes a substrate 201 of a first doping type (e.g. P-type). A crystalline layer 202 of the first doping type, such as P-type epitaxial layer or P-epi, is formed on the substrate 201. Photodiode regions 203, 214 and a well region PW of the first doping type are formed in the crystalline layer 202. The photodiode region 203 belongs to one of the pixels of the image sensor 100, and the photodiode region 214 belongs to an adjacent pixel. A surface pinning layer 210 and a gate insulation layer 211 are formed on a top surface 202a of the crystalline layer 202. For example, the gate insulation layer 211 includes oxide. Isolation structures 212, 213 are formed in the crystalline layer 202, in which the isolation structure 212 is formed between the photodiode region 203 and the photodiode region 214. For example, the isolation structures 212, 213 are shallow trench isolations (STI). In some embodiments, the isolation structure 212 further includes a deep well 215 of the first doping type.

A gate TX_G (also referred to a transfer gate) of the transfer transistor TX, a gate RES_G (also referred to a reset gate) of the reset transistor RES, a gate SF_G of the source follower SF, and a gate SEL_G (also referred to a select gate) of the select transistor SEL are formed on the gate insulation layer 211 (these gates are not shown in FIG. 2B). The gate TX_G covers a portion of the photodiode region 203. Doped region 204, 206, and 207 are formed in the crystalline layer 202. The doped region 204 is formed between the transfer gate TX_G and the reset gate RES_G as source/drain of the transfer transistor TX and the reset transistor RES. The doped region 204 is also electrically connected to the gate SF_G through a conductive structure 205. The doped region 206 is formed between the reset gate RES_G and the gate SF_G as source/drain of the reset transistor RES and the source follower SF. The doped region 207 is formed between the gate SF_G and the select gate SEL_G as source/drain of the source follower SF and the select transistor SEL. The doped regions 204, 206, and 207 have a second doping type (e.g. N-type) which is different from the first doping type.

The photodiode region 203 is connected to the doped region 206 under the top surface 202a of the crystalline layer 202 so as to provide the anti-blooming path 120. In detail, the isolation structure 213 extends from the top surface 202a of the crystalline layer 202, and is formed between the photodiode region 203 and the doped region 206. The photodiode region 203 has a first portion 221 of the second doping type (e.g. N-type) that extends toward the doped region 206 under the isolation structure 213. In addition, the doped region 206 has a second portion 222 of the second doping type that extends toward the photodiode region 203 under the isolation structure 213. The first portion 221 is connected to the second portion 222 under the isolation structure 213. That is, the photodiode region 203 is connected to the doped region 206 under the isolation structure 213. Note that the first portion 221 and the second portion 222 are illustrated by dotted line in FIG. 2A because they are covered by the isolation structure 213.

In some embodiments, the doped region 206 includes a highly doped region 224, a lightly doped drain 223 under the highly doped region 224, and the second portion 222 in which all of these 222/223/224 have the second doping type. In some embodiments, the second portion 222 is formed by thermal diffusion so that the doping concentration of the second portion 222 is less than that of the highly doped region 224, and the doping concentration of the second portion 222 progressively decreases toward the photodiode region 203. Therefore, it should be appreciated that there is no clear boundary between the lightly doped drain 223 and the second portion 222 in some embodiments. Because the first portion 221 and the second portion 222 have the same doping type and are connected to the each other, the barrier between the photodiode region 203 and doped region 206 is lower than that between the photodiode region 203 and the photodiode region 214. Referring to FIG. 1 and FIG. 2B, the doped region 206 is connected to the power supply VDD. When the photodiode region 203 is overexposed, extra photo electrons flow into the power supply VDD through the anti-blooming path 120 instead of flowing into the adjacent photodiode region 214. In some embodiments, the depth of the highly doped region 224 may be adjusted in which deeper depth leads to lower barrier between the first portion 221 and the second portion 222. In some embodiments, the depth of the isolation structure 213 may be adjusted in which deeper depth leads to higher barrier between the first portion 221 and the second portion 222.

Figure 3A:
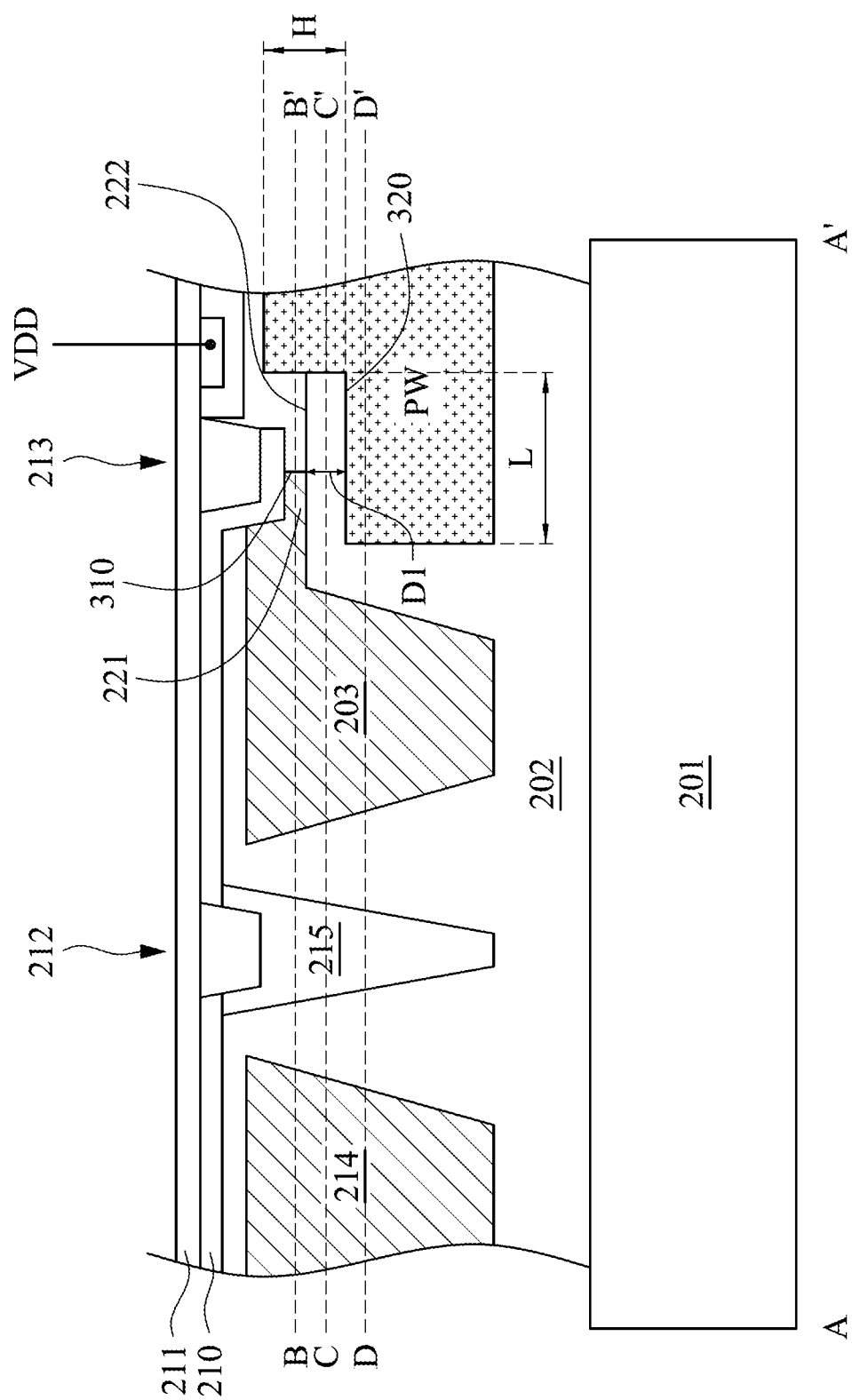
FIG. 3A is a cross-sectional view of the partial pixel structure in accordance with an embodiment.
Figure 3B:
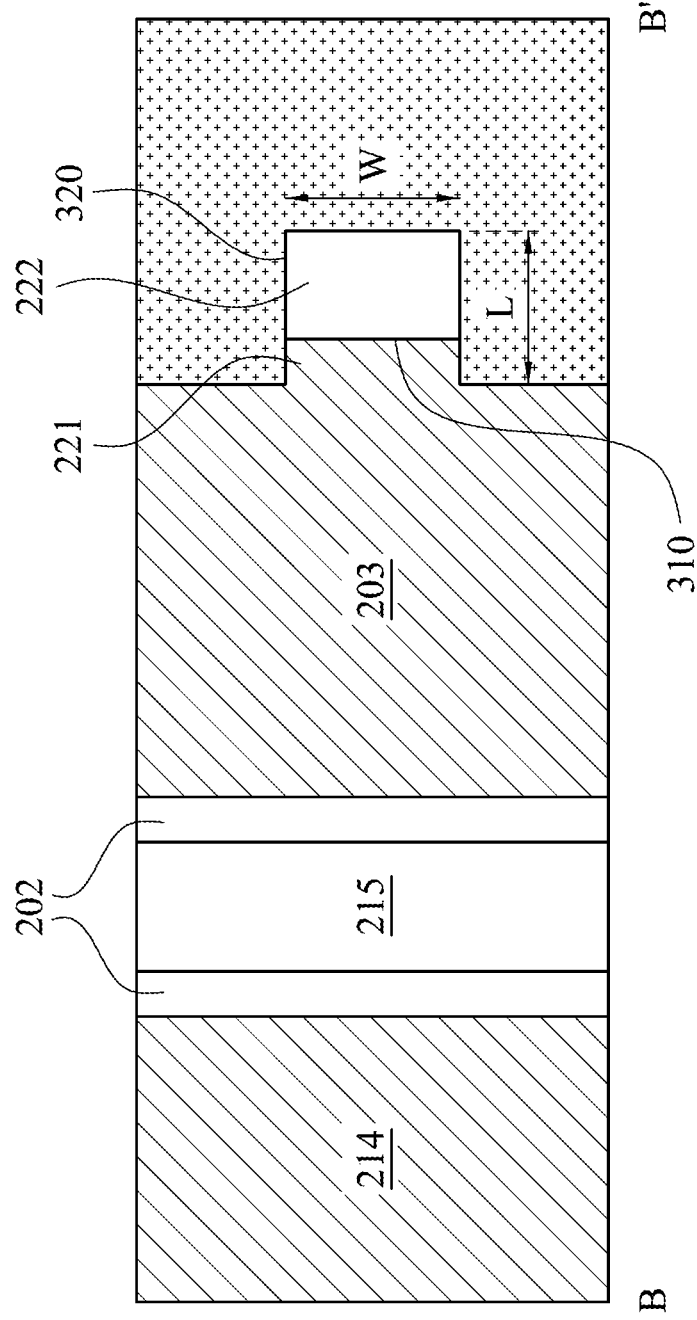
FIG. 3B is a schematic top view of the partial pixel structure along a section line BB' of FIG. 3A.
Figure 3C:
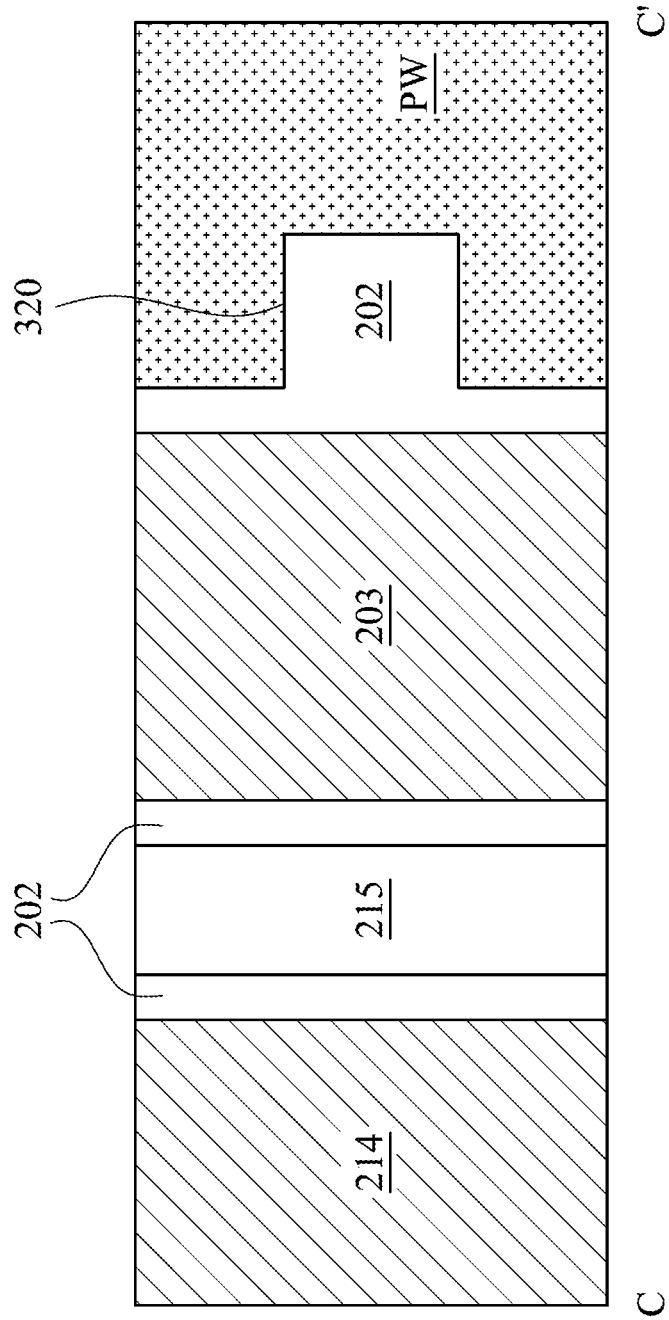
FIG. 3C is a schematic top view of the partial pixel structure along a section line CC' of FIG. 3A.
Figure 3D:
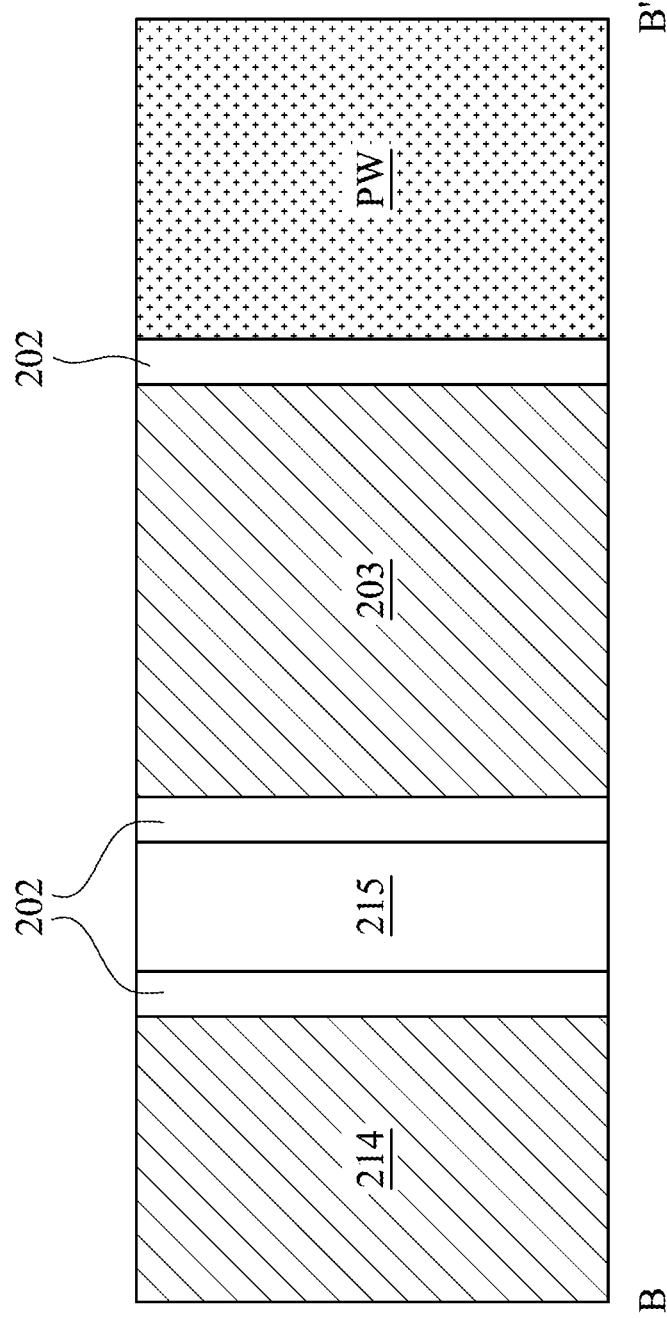
FIG. 3D is a schematic top view of the partial pixel structure along a section line DD' of FIG. 3A.

FIG. 3A is a cross-sectional view of the partial pixel structure in accordance with an embodiment. FIG. 3A is identical to FIG. 2B with different references for illustration. FIG. 3B is a schematic top view of the partial pixel structure along a section line BB' of FIG. 3A. FIG. 3C is a schematic top view of the partial pixel structure along a section line CC' of FIG. 3A. FIG. 3D is a schematic top view of the partial pixel structure along a section line DD' of FIG. 3A. Referring to FIG. 3A, in some embodiments, the well region PW has a notch for at least partially surrounding the first portion 221 and the second portion 222. In detail, the space under the isolation structure 213 is occupied by the well region PW, similar to the deep well 215, in the prior art. However, in the embodiment, the well region PW has a notch 320 with height H. The well region PW is vertically spaced from a connection interface 310 between the first portion 221 and the second portion 222 by a distance D1. Referring to FIG. 3B, the notch 320 of the well region PW partially surrounds the first portion 221 and second portion 222 from three sides. The notch 320 has a width W and a length L. Referring to FIG. 3C, the notch 320 of the well region PW is filled with the crystalline layer 202. Referring to FIG. 3D, the notch 320 is not seen in FIG. 3D.

Note that the height H, width W, and length L of the notch 320, and the distance D1 may be adjusted based on requirements. In general, when the height H, the width W, the length L, and the distance D1 get larger, the barrier formed by the first portion 221 and the second portion 222 gets lower so as to generate more efficient anti-blooming path 120.

Figure 4:
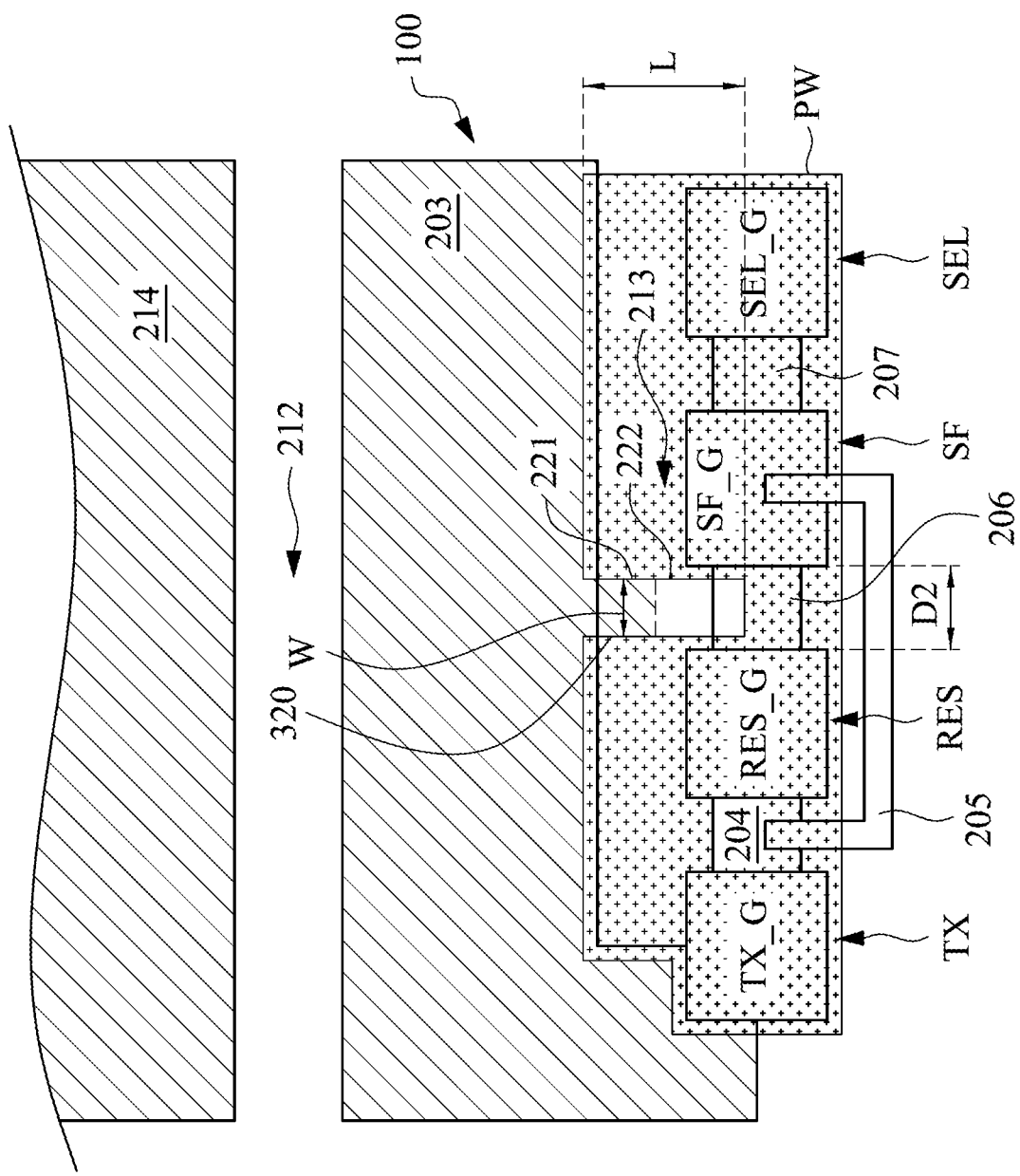
FIG. 4 is a top view of the pixel structure of image sensor in accordance with an embodiment.

FIG. 4 is a top view of the pixel structure of the image sensor in accordance with an embodiment. FIG. 4 is basically equal to FIG. 2A, but the well region PW is shown in FIG. 4 for illustration. Note that the well region PW is embedded in the crystalline layer 202, and therefore the well region PW cannot be "seen" from the top view. In FIG. 4, the notch 320 of the well region PW has the width W and the length L. The width W is shorter than a distance D2 between the reset gate RES_G and the gate SF_G. However, the notch 320 may extend into a channel region between the reset gate RES_G and the gate SF_G if more anti-blooming strength is needed, as long as the operation of the reset gate RES_G and the gate SF_G is not disturbed.

Figure 5A:
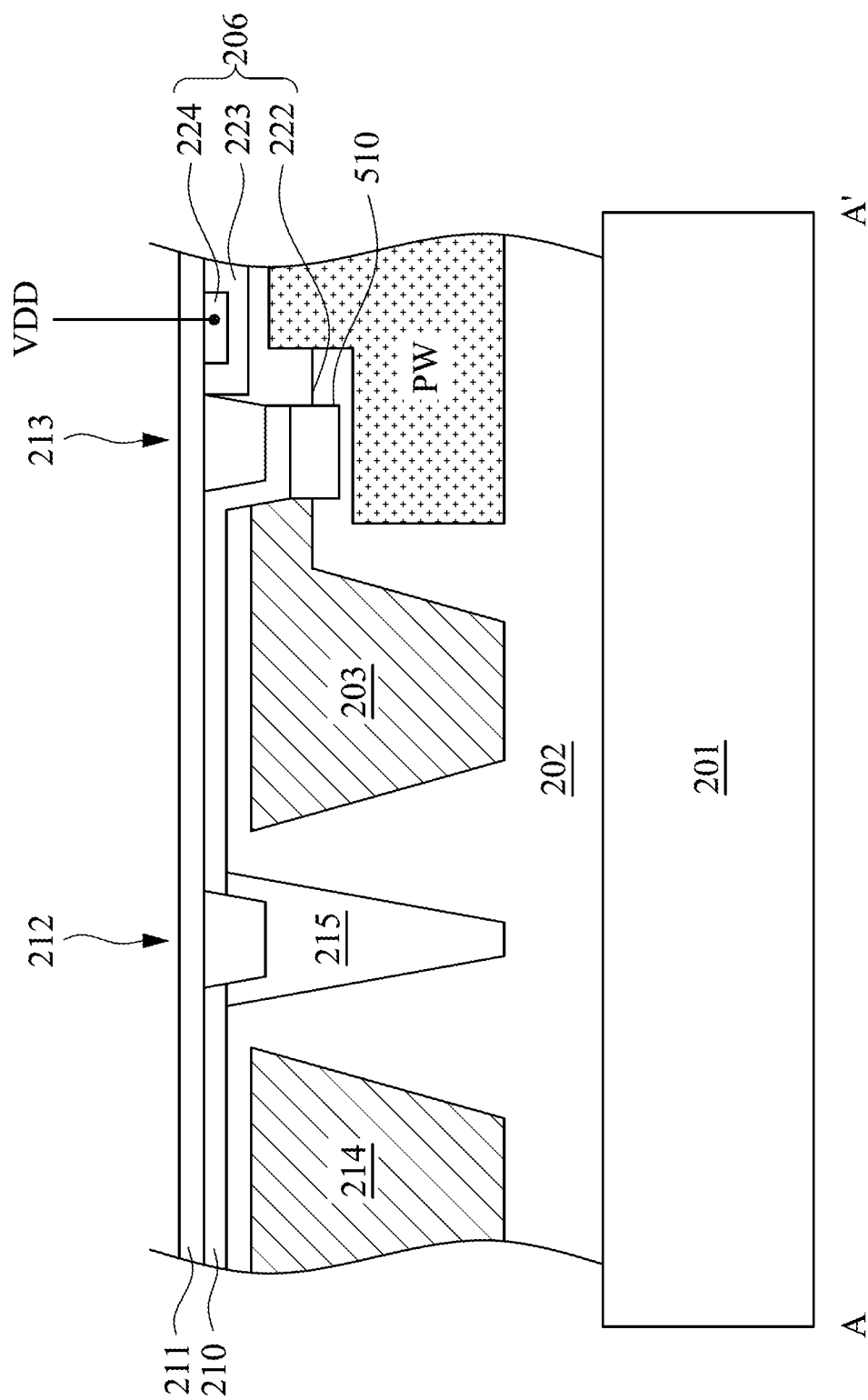
FIGS. 5A, 5B, and 5C are cross-sectional view of the partial pixel structure in accordance with some embodiments.
Figure 5B:
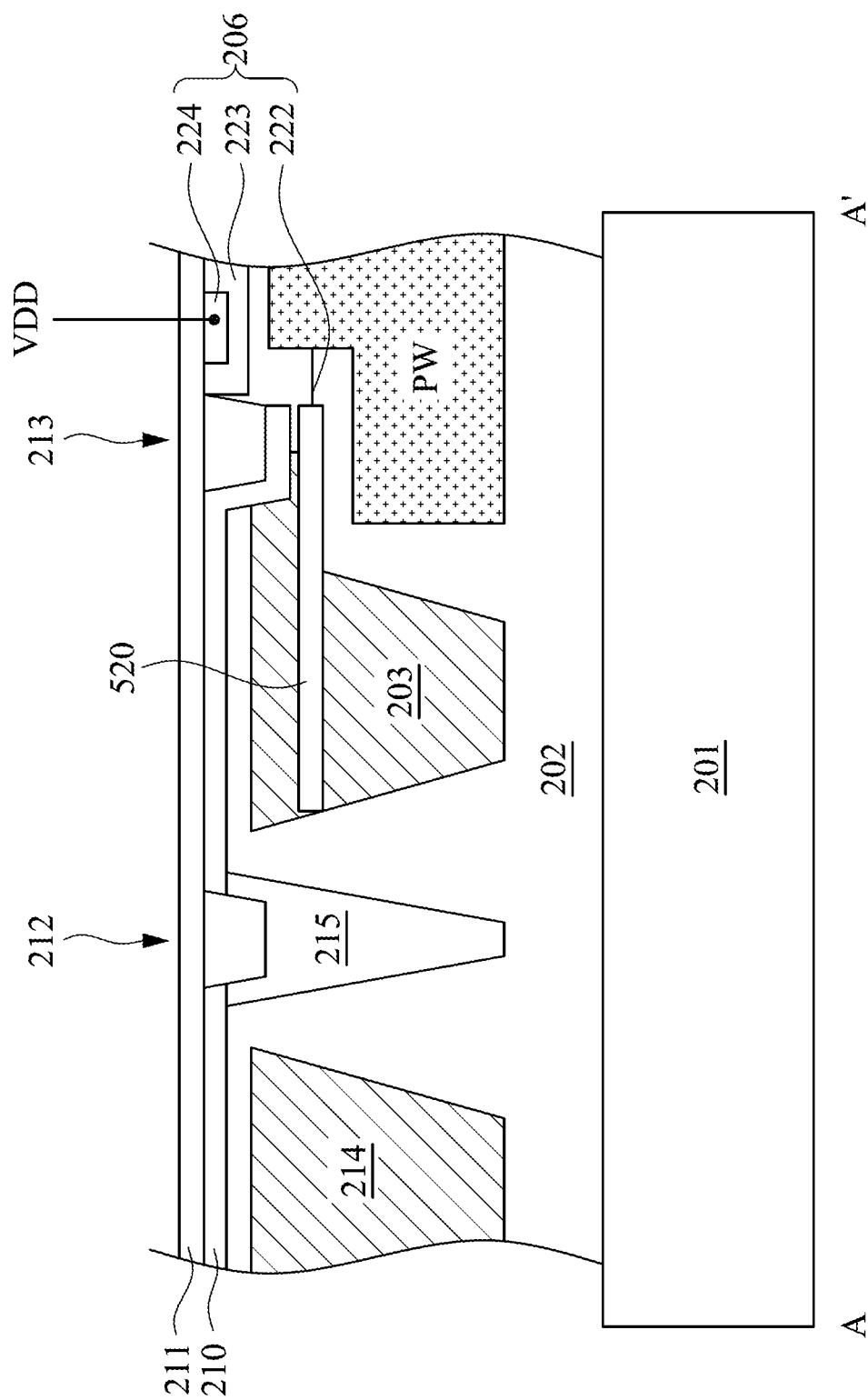
Figure 5C:
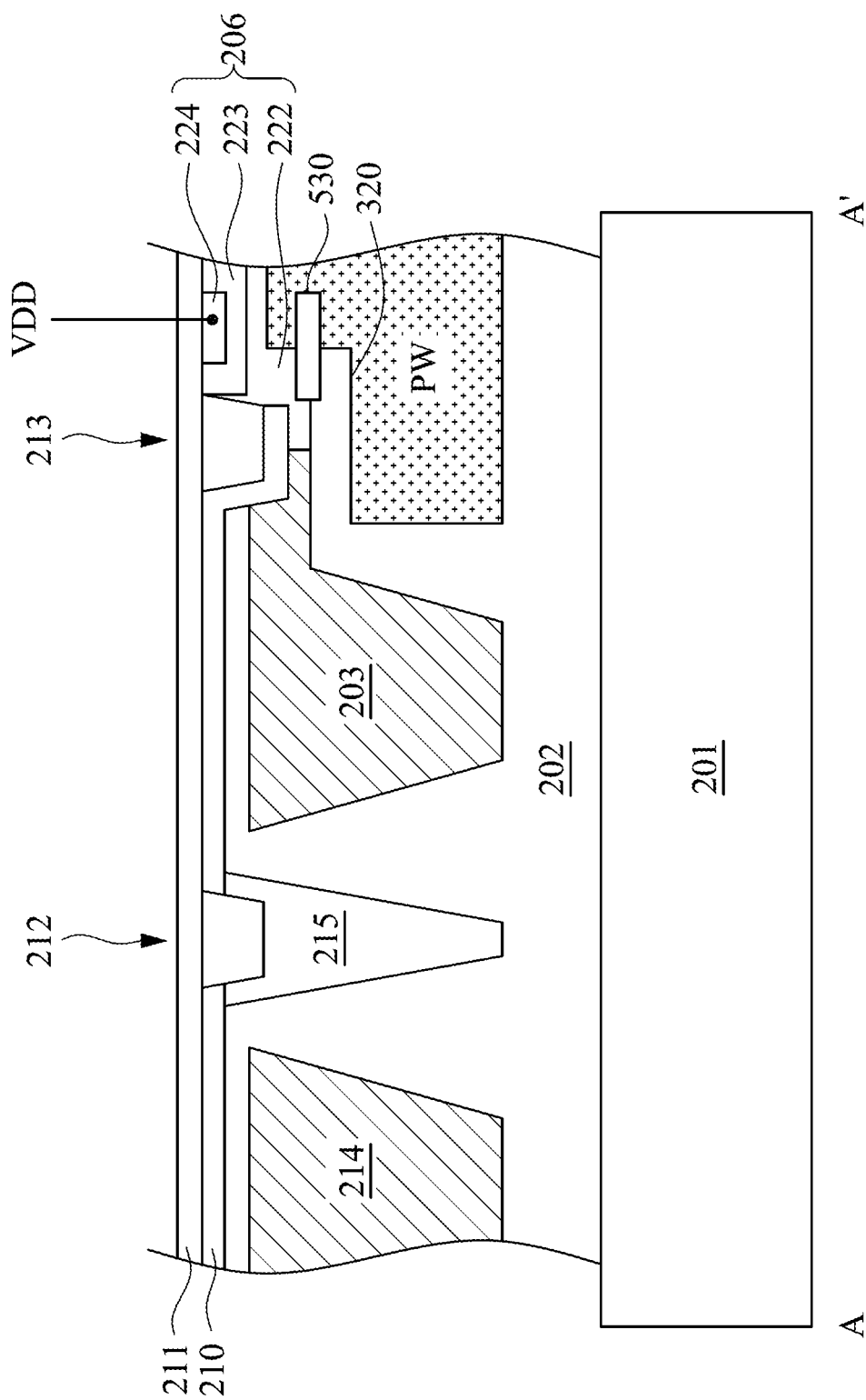

In some embodiments, in addition to the first portion 221 and the second portion 222 created mainly by thermal diffusions from the photodiode region 203 and the doped region 206, an implant region of second doping type may be formed in the crystalline layer 202 for adjusting the anti-blooming strength. For example, referring to FIG. 5A, an implant region 510 is formed under the isolation structure 213, and formed between the photodiode region 203 and the doped region 206. The implant region 510 is also connected to the photodiode region 203 and the doped region 206 to provide an anti-blooming path. Referring to FIG. 5B, an implant region 520 is formed under the isolation structure 213, but what is different from FIG. 5A is that the implant region 520 extends toward the photodiode region 203 so could be shared with one photodiode region 203 implant. Referring to FIG. 5C, an implant region 530 is partially formed in the notch 320, and connected to the doped region 206 and the well region PW. The implant region 530 may be an additional element of the doped region 206. Note that the lengths, widths, heights, and the locations of the implant regions 510, 520, and 530 may be adjusted based on requirement, which is not limited in the invention.

From another aspect, an electrical device is provided in some embodiments. The electrical device includes the aforementioned image sensor 100 with the aforementioned pixel structure. The electrical device may be a smart phone, any type of computer, digital camera, etc. that is not limited in the invention.

In some embodiments, the first doping type may be N-type, and the second doping type may be P-type.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A pixel structure, comprising:
a substrate;
a crystalline layer of a first doping type formed on the substrate;
a photodiode region formed in the crystalline layer;
a gate of a source follower transistor formed on a top surface of the crystalline layer;
a reset gate formed on the top surface of the crystalline layer; and
a doped region of a second doping type formed in the crystalline layer and formed between the reset gate and the gate of the source follower, wherein no gate portion of the pixel structure is formed directly above the doped region,
wherein the first doping type is different from the second doping type, and the photodiode region is connected to the doped region under the top surface of the crystalline layer as an anti-blooming path.

2. The pixel structure of claim 1, further comprising:
an isolation structure extending from the top surface of the crystalline layer and formed between the photodiode region and the doped region, wherein the photodiode region is connected to the doped region under the isolation structure.

3. The pixel structure of claim 2, wherein the photodiode region has a first portion of the second doping type that extends toward the doped region under the isolation structure, and the doped region has a second portion of the second doping type that extends toward the photodiode region under the isolation structure, and the first portion is connected to the second portion at a connection interface, wherein the connection interface is located directly under the isolation structure.

4. The pixel structure of claim 3, wherein the doped region comprises a highly doped region of the second doping type, a lightly doped drain of the second doping type located under the highly doped region, and the second portion which extends toward the photodiode region.

5. The pixel structure of claim 4, wherein a doping concentration of the second portion is less than a doping concentration of the highly doped drain.

6. The pixel structure of claim 3, further comprising:
a well region of the first doping type formed in the crystalline layer,
wherein the well region has a notch to at least partially surround the first portion and the second portion.

7. The pixel structure of claim 6, wherein the well region is vertically spaced from the connection interface between the first portion and the second portion by a distance.

8. The pixel structure of claim 6, wherein the width of the notch is shorter than a distance between the reset gate and the gate of the source follower.

9. The pixel structure of claim 1, wherein the first doping type is P-type, and the second doping type is N-type.

10. The pixel structure of claim 1, wherein the doped region is connected to a power supply.

11. An electrical device comprising:
a pixel structure comprising:
a substrate;
a crystalline layer of a first doping type formed on the substrate;
a photodiode region formed in the crystalline layer;
a gate of a source follower transistor formed on a top surface of the crystalline layer;
a reset gate formed on the top surface of the crystalline layer; and
a doped region of a second doping type formed in the crystalline layer and formed between the reset gate and the gate of the source follower, wherein no gate portion of the pixel structure is formed directly above the doped region,
wherein the first doping type is different from the second doping type, and the photodiode region is connected to the doped region under the top surface of the crystalline layer as an anti-blooming path.

12. The electrical device of claim 11, wherein the pixel structure further comprises:

an isolation structure extending from the top surface of the crystalline layer and formed between the photodiode region and the doped region, wherein the photodiode region is connected to the doped region under the isolation structure.

13. The electrical device of claim 12, wherein the photodiode region has a first portion of the second doping type that extends toward the doped region under the isolation structure, and the doped region has a second portion of the second doping type that extends toward the photodiode region under the isolation structure, and the first portion is connected to the second portion at a connection interface, wherein the connection interface is located directly under the isolation structure.

14. The electrical device of claim 13, wherein the doped region comprises a highly doped region of the second doping type, a lightly doped drain of the second doping type located under the highly doped region, and the second portion which extends toward the photodiode region.

15. The electrical device of claim 14, wherein a doping concentration of the second portion is less than a doping concentration of the highly doped drain.

16. The electrical device of claim 13, wherein the pixel structure further comprises:
a well region of the first doping type formed in the crystalline layer,
wherein the well region has a notch to at least partially surround the first portion and the second portion.

17. The electrical device of claim 16, wherein the well region is vertically spaced from the connection interface between the first portion and the second portion by a distance.

18. The electrical device of claim 16, wherein the width of the notch is shorter than a distance between the reset gate and the gate of the source follower.

19. The electrical device of claim 11, wherein the first doping type is P-type, and the second doping type is N-type.

20. The electrical device of claim 11, wherein the doped region is connected to a power supply.

* * * * *